US010512866B2

(12) United States Patent
Chang et al.

(10) Patent No.: US 10,512,866 B2
(45) Date of Patent: Dec. 24, 2019

(54) FILTER HOUSING FOR FILTER FAN

(71) Applicant: Hoffman Enclosures, Inc., Anoka, MN (US)

(72) Inventors: Seng Chang, Minneapolis, MN (US);
Douglas L. Neuenfeldt, Anoka, MN (US); Jeffrey Thibedeau, Robbinsdale, MN (US); William J. Nepsha, Zimmerman, MN (US); Richard L. Raisanen, Coon Rapids, MN (US); Michael J. Koehler, Ramsey, MN (US); Paul H. Landgraf, White Bear Lake, MN (US); Klaus-Peter Bachmann, Weissach (DE); Adam Pawlowski, Waldbronn (DE)

(73) Assignee: Hoffman Enclosures, Inc., Anoka, MN (US)

( * ) Notice: Subject to any disclaimer, the term of this patent is extended or adjusted under 35 U.S.C. 154(b) by 152 days.

(21) Appl. No.: 15/432,295

(22) Filed: Feb. 14, 2017

(65) Prior Publication Data
US 2017/0232373 A1  Aug. 17, 2017

Related U.S. Application Data

(60) Provisional application No. 62/295,874, filed on Feb. 16, 2016.

(51) Int. Cl.
*B01D 27/08* (2006.01)
*B01D 29/07* (2006.01)
(Continued)

(52) U.S. Cl.
CPC ..... *B01D 46/0005* (2013.01); *B01D 46/0041* (2013.01); *H05K 7/20172* (2013.01);
(Continued)

(58) Field of Classification Search
CPC ........ B01D 27/08; B01D 29/07; B01D 35/30; B01D 46/00; B01D 46/0005; B01D 46/52;
(Continued)

(56) References Cited

U.S. PATENT DOCUMENTS 5,201,879 A   4/1993 Steele
5,462,569 A   10/1995 Benjamin
(Continued)

FOREIGN PATENT DOCUMENTS

AU    2014270389 A1   11/2015
DE       19532016 C1   10/1996

OTHER PUBLICATIONS

Rittal—The System.; [online]; 2017 Copyright Rittal Corporation; <http://www.rittal.com/us-en/product/list.action; sessionid=18481D550BF15851A6E168E27A3872BC?categoryPath=/PG0001/PG0168KLIMA1/PGR1932KLIMA1/PG0201KLIMA1>.

(Continued)

*Primary Examiner* — Minh Chau T Pham
(74) *Attorney, Agent, or Firm* — Quarles & Brady LLP

(57) ABSTRACT

A filter housing can support filter media for a fan arrangement. The filter housing can include a filter body with a first opening at a first end and a second opening at a second end. A bell portion can be disposed between the air inlet opening and the air outlet opening and can define a cavity within the housing body. An air-permeable filter support can extend into the cavity to support the filter media within the cavity, with the filter media spaced apart from at least one of the first and second openings.

18 Claims, 10 Drawing Sheets

(51) Int. Cl.
    *B01D 35/30*    (2006.01)
    *B01D 46/00*    (2006.01)
    *B01D 46/52*    (2006.01)
    *B01D 50/00*    (2006.01)
    *G06F 17/50*    (2006.01)
    *H05K 7/20*    (2006.01)

(52) U.S. Cl.
    CPC ..... *H05K 7/20181* (2013.01); *B01D 2271/02* (2013.01); *B01D 2279/45* (2013.01)

(58) Field of Classification Search
    CPC ............. B01D 50/00; B01D 46/0041; B01D 2279/45; B01D 2271/02; G06F 17/50; H05K 7/20172; H05K 7/20181
    USPC ...... 55/472, 497, 320, 385.1, 502, 504, 501, 55/490, 499, 428, 473
    See application file for complete search history.

(56) References Cited

U.S. PATENT DOCUMENTS

| | | | |
|---|---|---|---|
| 5,514,036 A | | 5/1996 | Lin |
| 5,759,217 A | * | 6/1998 | Joy .................... B01D 46/0039 55/320 |
| 5,769,916 A | | 6/1998 | Immel |
| 6,072,119 A | | 6/2000 | Nicolai et al. |
| 6,110,245 A | | 8/2000 | Schlag et al. |
| 6,185,097 B1 | | 2/2001 | Behl |
| 6,193,339 B1 | | 2/2001 | Behl et al. |
| 6,297,950 B1 | | 10/2001 | Erwin |
| 6,319,116 B1 | | 11/2001 | Behl |
| 6,447,587 B1 | | 9/2002 | Pillion et al. |
| 6,579,333 B2 | | 6/2003 | Huang |
| 6,676,505 B2 | | 1/2004 | Behl |
| 6,699,301 B1 | | 3/2004 | Eisenhauer |
| 6,712,889 B2 | | 3/2004 | Pillion et al. |
| 6,776,706 B2 | | 8/2004 | Kipka et al. |
| 6,817,940 B2 | | 11/2004 | Pfannenberg |
| 7,077,893 B2 | | 7/2006 | Guilliard |
| 7,088,584 B2 | | 8/2006 | Chen |
| 7,322,881 B2 | | 1/2008 | Ishii |
| 7,323,027 B1 | | 1/2008 | Fu |
| 7,466,545 B2 | | 12/2008 | Hung |
| 8,152,885 B2 | | 4/2012 | Pfannenberg |
| 8,601,740 B2 | | 12/2013 | Tu et al. |
| 8,727,842 B2 | | 5/2014 | Pfannenberg |
| 8,864,560 B2 | | 10/2014 | Yeh et al. |
| 8,951,322 B2 | | 2/2015 | Pfannenberg et al. |
| 9,039,500 B2 | | 5/2015 | Pfannenberg |
| 9,237,674 B2 | | 1/2016 | Hartmann et al. |
| 2008/0014858 A1 | | 1/2008 | Pfannenberg |
| 2008/0045134 A1 | | 2/2008 | Pfannenberg |
| 2008/0121107 A1 | | 5/2008 | Pfannenberg |
| 2008/0151492 A1 | | 6/2008 | Maddox |
| 2009/0133371 A1 | * | 5/2009 | Siber .................. B01D 46/0002 55/501 |
| 2009/0185348 A1 | | 7/2009 | Bretschneider et al. |
| 2010/0000190 A1 | * | 1/2010 | Kidman ............. B01D 46/0005 55/502 |
| 2010/0236205 A1 | * | 9/2010 | Braithwaite .......... B01D 46/10 55/499 |
| 2011/0132198 A1 | * | 6/2011 | Gallo .................. B01D 46/0023 96/222 |
| 2013/0035032 A1 | | 2/2013 | Schneider et al. |
| 2013/0067875 A1 | | 3/2013 | Hartmann et al. |
| 2013/0309074 A1 | | 11/2013 | Yang et al. |
| 2014/0215981 A1 | * | 8/2014 | Pfannenberg ......... F04D 29/646 55/501 |
| 2016/0016102 A1 | | 1/2016 | Maddox |

OTHER PUBLICATIONS

Pfannenberg Electro-Technology for Industry; [online]; Copyright 2012 Pfannenberg Incorporated; <http://www.pfannenbergusa.com/filterfan>.
Pentair Equipment Protection; [online]; Copyright 2017 Pentair; <http://www.pentairprotect.com/en/na/Products/TFP-Side-Mount>.
Rubsamen & Herr green globe concepts; [online]; Copyright by MC² Marketing & Communication, erstellt mit FIRMATIC-die professionelle e-Marketing Lösung; <http://www.ruebsamen-und-herr.com/filter_fans_and_exhaust_filters.html>.

* cited by examiner

FILTER HOUSING FOR FILTER FAN

RELATED APPLICATION

This application claims priority to U.S. Provisional application. Ser. No. 62/295,874 filed Feb. 16, 2016, the entire disclosure of which is incorporated herein by reference.

BACKGROUND

Fan assemblies can be used to provide cooling airflow or other ventilation for electrical enclosures and other installations. In some cases, it may be useful to equip a fan assembly with filter media, in order to prevent dust, liquid, or other materials from passing through the fan assembly to a protected area (e.g., the interior of an electrical enclosure).

SUMMARY

Some embodiments of the invention provide a filter housing for a fan assembly configured to use filter media. A housing body can include a first side and a second side opposite the first side, with the first side including a flow opening for fan-driven airflow. The housing body can also include a bell portion at least partly defining a cavity between the fan and second sides. The housing body can further include at least one filter support with a corresponding at least one support surface for supporting the filter media within the cavity. The at least one support surface can be spaced apart from the flow opening of the housing body to support the filter media within the cavity with the filter media spaced apart from the flow opening.

Some embodiments of the invention provide a housing body for securing filter media relative to a fan and an enclosure. An air inlet opening can be included at a first axial end of the housing body. An air outlet opening can be included at a second axial end of the housing body that is removed in a first direction from the air inlet opening. A bell portion can be disposed between the mounting flange and the air outlet opening and can define a cavity within the housing body.

The bell portion can include a first side-wall portion extending at least partly in the first direction, the first side-wall portion at least partly defining a mounting space for the filter media. The bell portion can also include an inwardly tapered portion extending at least partly between the first side-wall portion and the air outlet opening. The bell housing can further include a plurality of support structures extending from the inwardly tapered portion into the cavity to support the filter media in the mounting space.

A grating hub can extend from the air outlet opening into the cavity. The grating hub can provide an air-permeable structure to maintain the filter media spaced apart from the air outlet opening.

Some embodiments of the invention provide another a body for securing filter media relative to a fan and an enclosure. An air inlet opening can be included at a first axial end of the housing body. An air outlet opening can, be included at a second axial end of the housing body that is removed in a first direction from the air inlet opening. A bell portion can be disposed between the mounting flange and the air outlet opening and can define a cavity within the housing body.

The bell portion can include a first side-wall portion extending at least partly in the first direction, the first side-wall portion at least partly defining a mounting space for the filter media. The bell portion can also include first and second ribs extending into the cavity. The bell portion can further include a support wall extending within the cavity along a lateral side of the bell portion between the first and second ribs. The first and second ribs and the support wall can be configured to support the filter media within the mounting space.

Some embodiments of invention provide a housing body for securing filter media relative to a fan and an enclosure. An air inlet opening can be included at a first axial end of the housing body. An air outlet opening can be included at a second axial end of the housing body that is removed in a first direction from the air inlet opening. Side walls can be disposed between the mounting flange and the air outlet opening and can define a cavity within the housing body. A grating can be disposed within the cavity and extend between the side walls. A side of the grating facing the air inlet opening can be spaced apart from the air outlet opening to support the filter media with the filter media spaced apart from the air outlet opening by substantially more than an axial thickness of the grating.

Some embodiments of the invention provide a filter housing for a fan assembly that is configured to use filter media. The filter housing can include a first side with a first flow opening for a fan-driven airflow, and a second side, opposite the first side, with a second flow opening for the fan-drive airflow. A bell portion can at least partly define a cavity between the first and second flow openings. An air-permeable filter-support structure can extend from the second side of the filter housing into the cavity. The air-permeable filter-support structure can include a filter-support portion configured to support the filter media within the cavity, and a side structure that extends at a non-zero angle relative to the filter-support portion to support the filter-support portion relative to the bell portion.

Some embodiments of the invention provide a housing body for supporting filter media relative to a fan and an enclosure. The housing body can include an air inlet opening at a first end of the housing body and an air outlet opening at a second end of the housing body. A bell portion can be disposed between the air inlet opening and the air outlet opening and can define a cavity within the housing body. A grating hub can extend into the cavity to support the filter media within the cavity, with the filter media spaced apart from the air outlet opening.

Some embodiments of the invention provide a housing for supporting filter media relative to a fan and an enclosure. The housing can include a unitary housing body that includes an air inlet opening, an air outlet opening, one or more side walls, and an air-permeable support structure.

The air inlet opening can be disposed at a first end of the unitary housing body, and can be configured to admit into the unitary housing body an air flow driven by the fan. The air outlet opening can be disposed at a second end of the unitary housing body, and can be configured to discharge from the unitary housing body the air flow driven by the fan. The one or more side walls can be disposed between the air inlet opening and the air outlet opening, with the one or more side walls at least partly defining a cavity within the unitary housing body.

The air-permeable support structure can be disposed within the cavity between the one or more side walls. The air-permeable support structure can have a thickness in a direction that extends between the air inlet opening and the air outlet opening, and can be configured to permit the air flow driven by the fan to pass from the air inlet opening and the air outlet opening. A side of the air-permeable support structure that faces the air inlet opening can be spaced apart from the air outlet opening by substantially more than the thickness of the air-permeable support structure. Accordingly, the air-permeable support structure can support the filter media within the unitary housing body with the filter media spaced apart from the air outlet opening by substantially more than the thickness of the air-permeable support structure.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
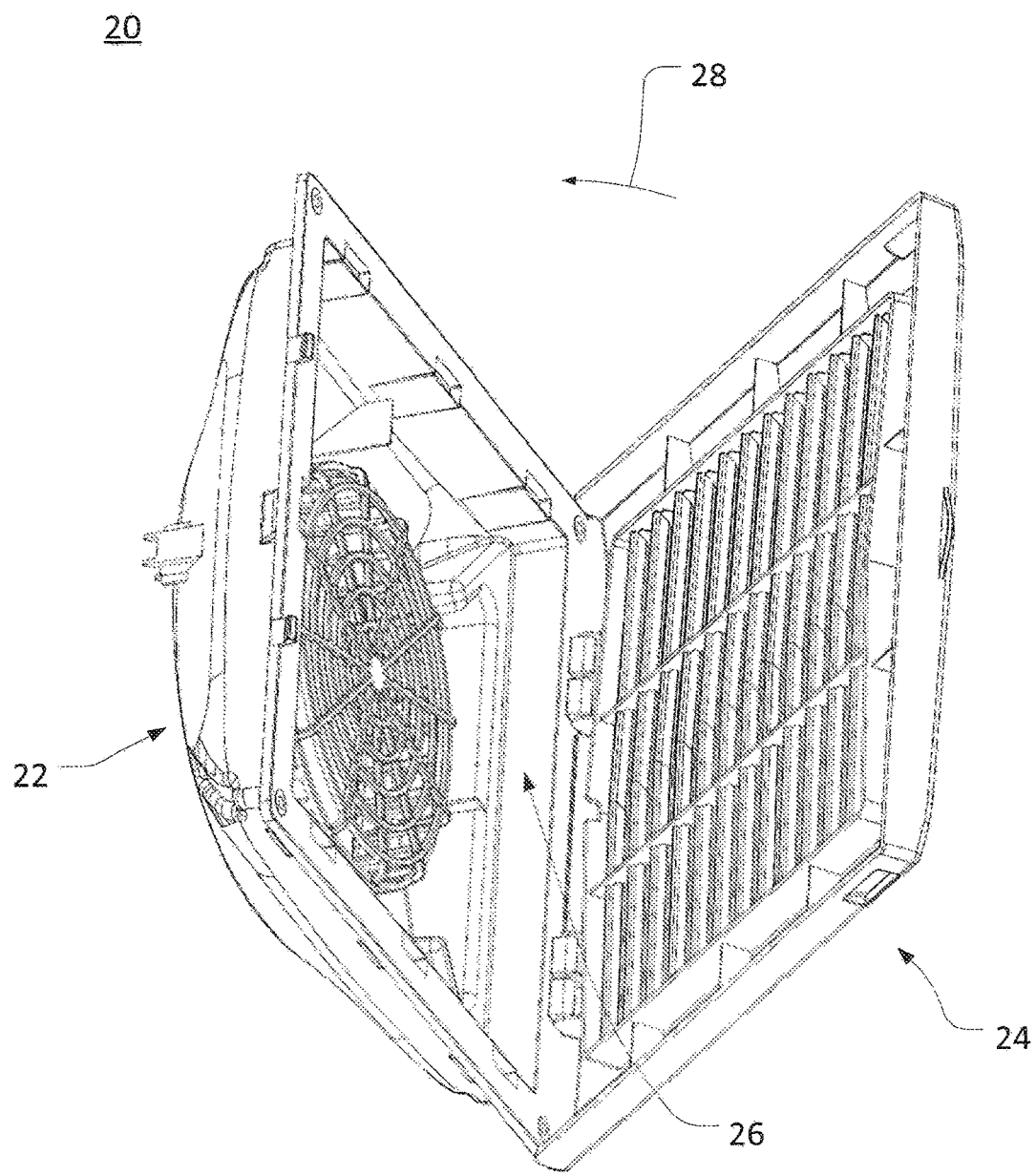
FIG. 1 is a front, left, top isometric view of a filter housing for a filter fan according to one embodiment of the invention, with a cover of the filter housing in an open orientation.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Likewise, the phrases "at least one of A, B, and C," "one or more of A, B, and C," and the like, are meant to indicate A, or B, or C, or any combination of A, B, and/or C. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent, to those skilled in the art, and the generic principles herein can be applied to other embodiments and applications without departing from embodiments of the invention. Thus, embodiments of the invention are not intended to be, limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

For convenience of presentation, in some figures that include multiple instances of similar features (e.g., multiple ribs, struts, or parts of a grating), only some of the similar features may be specifically indicated by reference number. One of skill in the art will recognize that the features not labeled with reference numbers can include similar aspects and perform similar functions to similar features that are labeled with reference numbers. Similarly, some features may be labeled with reference numbers in only select figures.

As used herein, unless otherwise specified or limited, "air-permeable" describes a feature that a fan-driven air flow can pass through. For example, a set of slats spaced apart from each other, a grating, or a plate with holes can be considered air-permeable structures if a fan-driven air flow can pass through the space between the slats, the grating, or the holes in the plates. Other air permeable configurations could include mesh (e.g., a finely-structured grating) or similar structures.

Also as used herein, unless otherwise specified or limited, "hub" describes a feature that protrudes, or otherwise similarly extends, from another structure. In some configurations, a hub can also protrude, or otherwise similarly extend, from a first structure into a cavity defined by the first or another structure. For example, in some embodiments discussed below, an air permeable hub can extend from a portion of a filter housing into a cavity defined by the filter housing.

Also as used herein, in the context of air flows and structures to facilitate air flows, and unless otherwise specified or limited, "axial" is used to refer to a main general direction of the air flows and "lateral" is used to refer to one or more directions that are generally perpendicular to the "axial" direction. For example, in a fan housing with an air inlet opening and an air outlet opening, an "axial" direction extends along the general direction of air flow from the air inlet opening to the air outlet opening. Correspondingly, a "lateral" direction can extend generally perpendicularly to the general direction of air flow from the air inlet opening to the air outlet opening.

FIG. 1 illustrates a filter housing 20 for a fan assembly according to one embodiment of the invention. Generally, the filter housing 20 includes a housing body 22 that is removably and pivotally secured to a housing cover 24. In, the embodiment illustrated, the housing body 22 is configured to hold, filter media, such as a single-piece filter (not shown in FIG. 1), within an internal area 26 that is at least partly enclosed by the housing body 22. The internal area 26 can also be partly enclosed by the housing cover 24, when the housing cover 24 is moved to a closed orientation (not shown) relative to the housing body 22. As illustrated in FIG. 1, the housing cover 24 has been pivoted open to allow access to the internal area 26. To close the housing cover 24 over the internal area 26, the housing cover 24 can be pivoted towards the housing body 22 as indicated by arrow 28.

Figure 2:
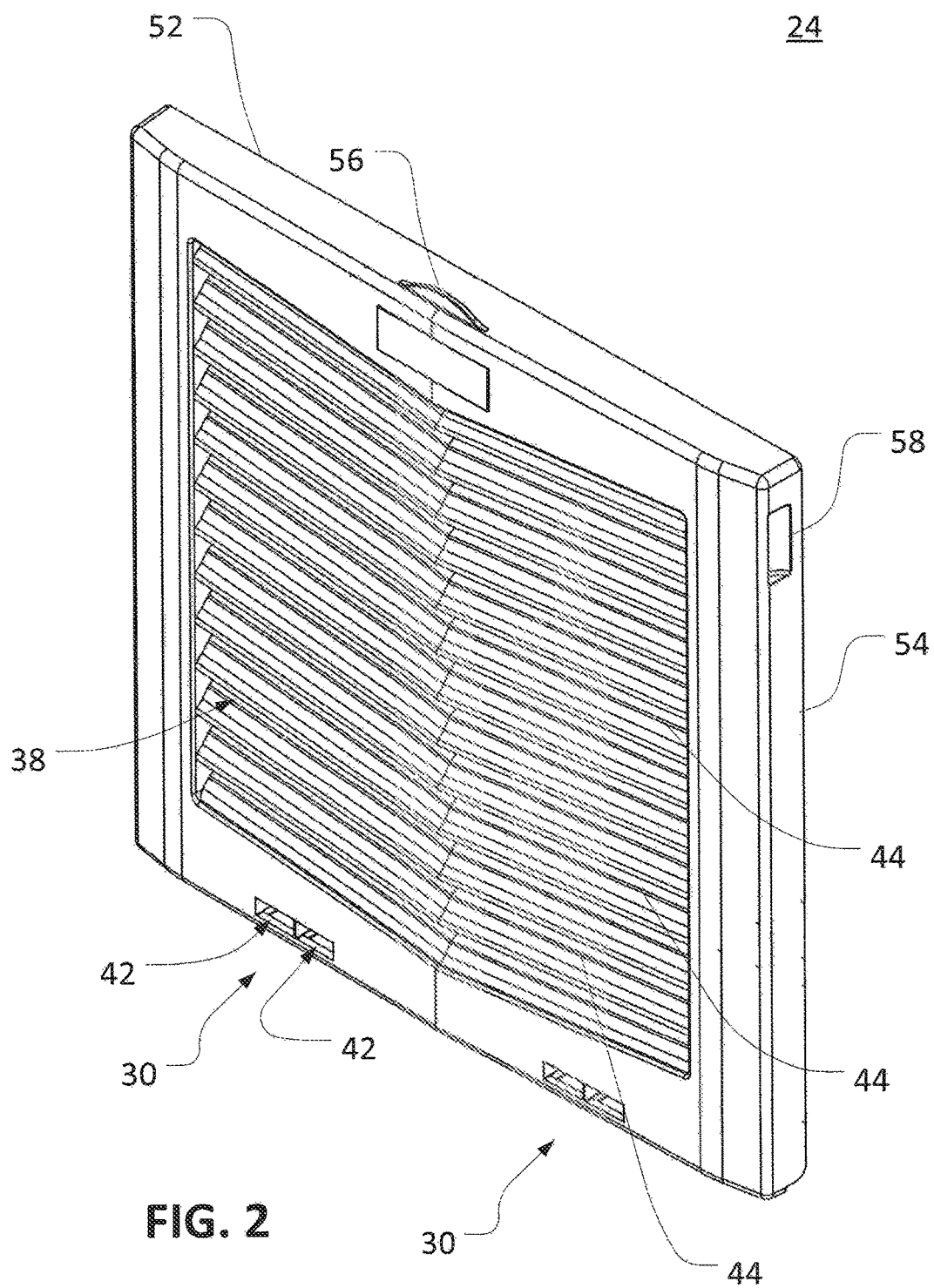
FIG. 2 is a front, right, top isometric view of the cover of FIG. 1.
Figure 3:
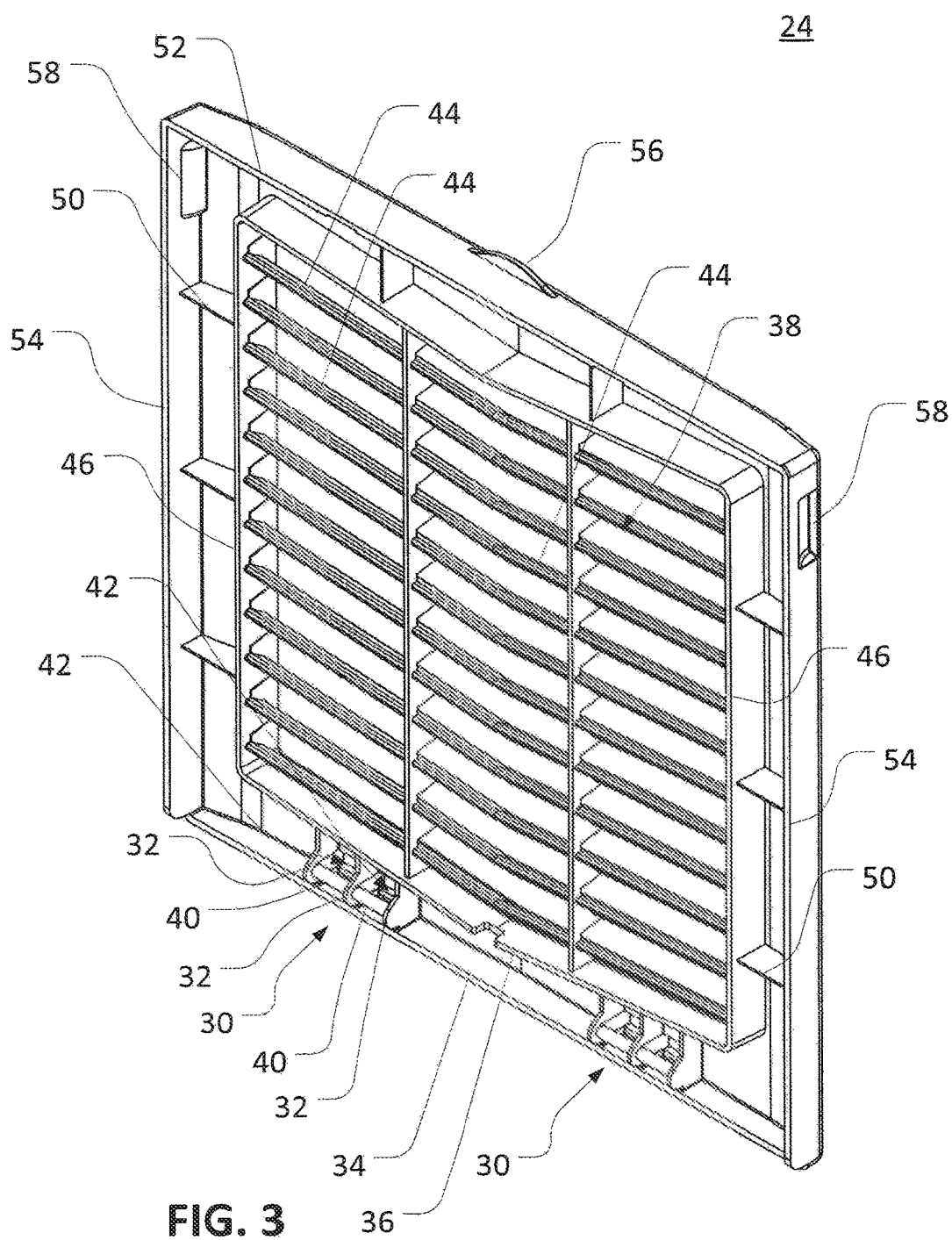
FIG. 3 is a back, left, top isometric view of the cover of FIG. 1.

To facilitate opening and closing, a housing cover can be hingedly attached to a housing body and can include features to secure the housing cover in a closed orientation and to allow a user to easily open the housing cover from the closed orientation. For example, as illustrated in particular in FIGS. 2 and 3, the lower end of the housing cover 24 includes a set of hinges 30 that can be secured to corresponding features on the housing body 22 (as also discussed below). As illustrated in FIG. 3 in particular, the hinges 30 are configured with supporting ribs 32 that extend between a lower skirt 34 of the housing cover 24 and a lower skirt 36 of a grille 38. Sets of hinge pins 40 extend between the ribs 32, and a set of openings 42 are provided in the front of the housing, cover 24 (see FIG. 2) aligned with the ribs 32. This orientation of the openings 42 can, for example, be useful during the manufacturing of the housing cover 24.

A housing cover can be generally configured to direct and regulate air flow through the housing cover to (or from) an associated fan. In the embodiment illustrated, for example, the grille 38 of the housing cover 24 includes a set of louvers 44 arranged within a grating perimeter that includes the lower skirt 36 as well as side skirts 46 and an upper skirt 48. The louvers 44 generally angle downwardly from the inside of the housing cover 24 to the outside of the housing cover 24. The louvers 44 also angle somewhat downwardly from the side skirts 46 towards a centerline of the grille 38, to generally form chevron profiles, as viewed from the outside of the housing cover 24. The grille 38 can be strengthened by various structures, including ribs 50 extending between a top skirt 52 and side skirts 54 of the housing cover 24 and the upper skirt 48 and the side skirts 46 of the grating.

To allow a user to open and close the housing cover 24 relatively easily, a generally crescent-shaped tab 56 is provided on the outside of the top skirt 52 of the housing cover 24. Similarly, a set of rounded indents 58 are provided in each of the side skirts 54 of the housing cover 24. To open or close the housing cover 24, a user can accordingly manually (or otherwise) engage one or more of the tab 56 and the indents 58 in order to apply a pivoting force to the housing cover 24 relative to the housing body 22.

Figure 4:
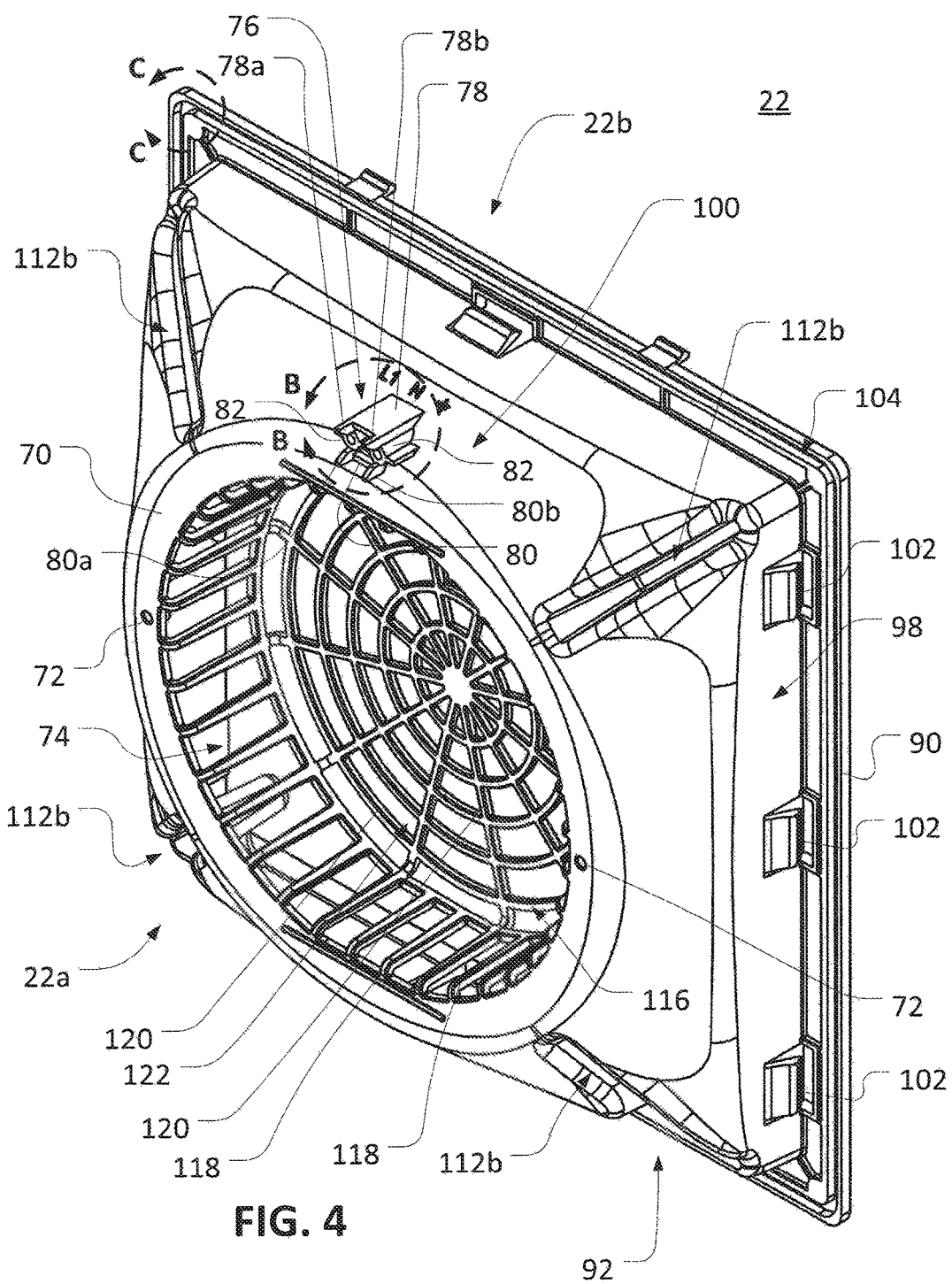
FIG. 4 is a back, left, top isometric view of a housing body of the filter housing of FIG. 1.
Figure 5:
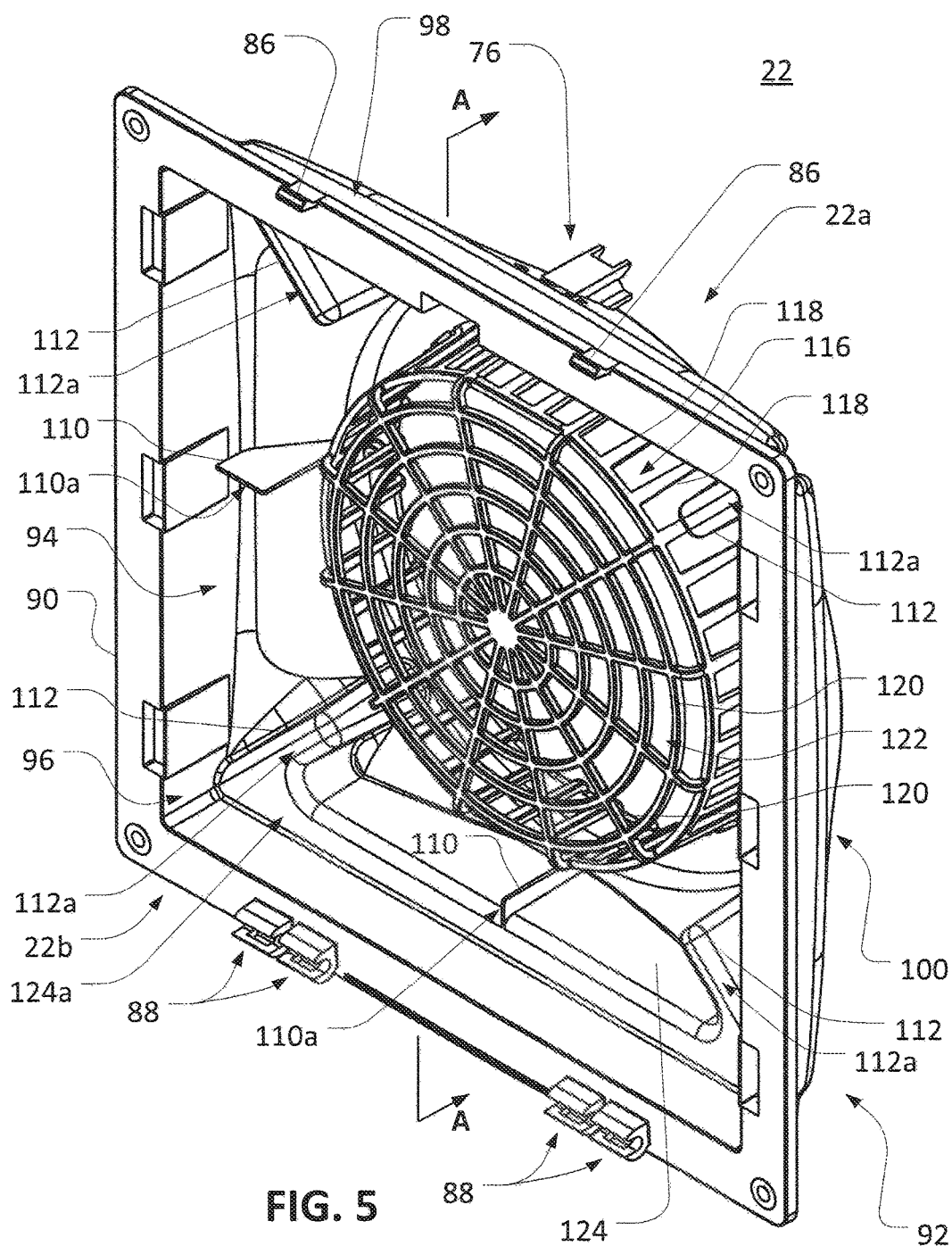
FIG. 5 is a front, right, top isometric view of the housing body of FIG. 4.
Figure 6:
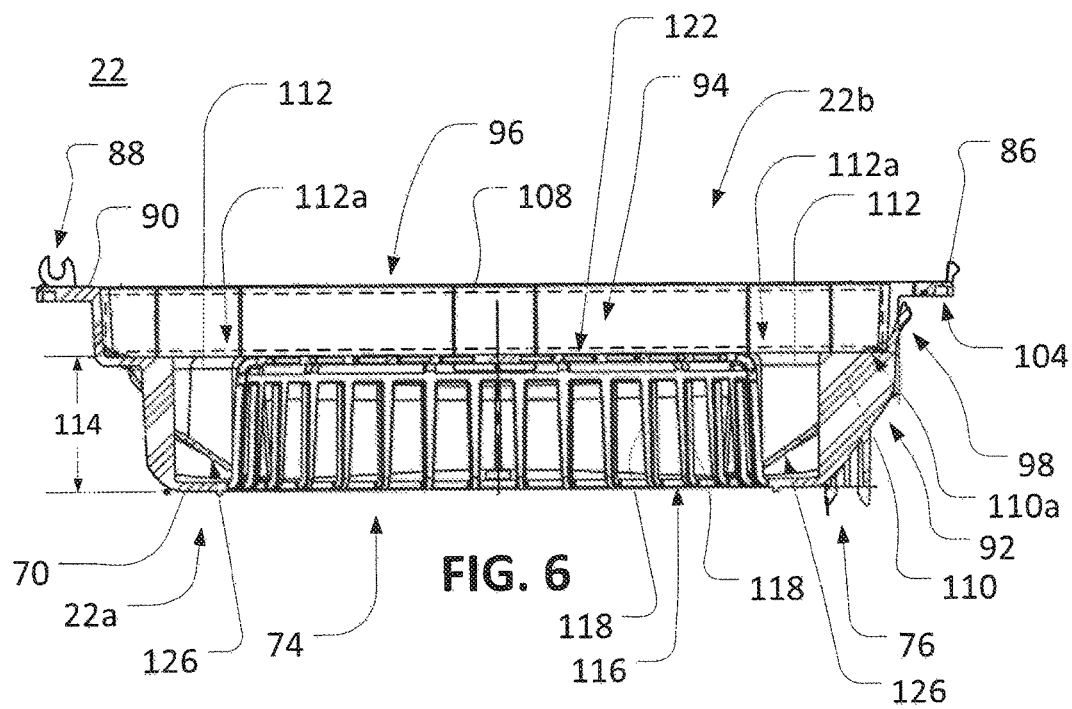
FIG. 6 is a cross-sectional view of the housing body of FIG. 4, taken along plane A-A of FIG. 5.

FIGS. 4 through 6 further illustrate various details of the housing body 22. Generally, the housing body 22 is formed as a unitary body, with a first side 22a and a second side 22b corresponding to opposite axial ends of the housing body 22. In the embodiment illustrated, the first side 22a is configured as a fan side of the housing, with a flattened mounting face 70 on which a fan (not shown) can be seated and a set of holes 72 through which fasteners (not shown) can extend to secure the fan to the housing body 22. The mounting face 70 generally surrounds an outlet opening 74, through which air flow driven by the fan can exit the housing body 22. Ira some embodiments, a fan for attachment to the mounting face 70 can have a circular perimeter profile with a diameter that is generally similar to the profile and diameter of the illustrated annular configuration of the mounting face 70. In some embodiments, a spacer (not shown) can be attached to the housing body 22 at the mounting face 70, and a fan attached to the spacer rather than directly to the housing body 22.

Figure 7:
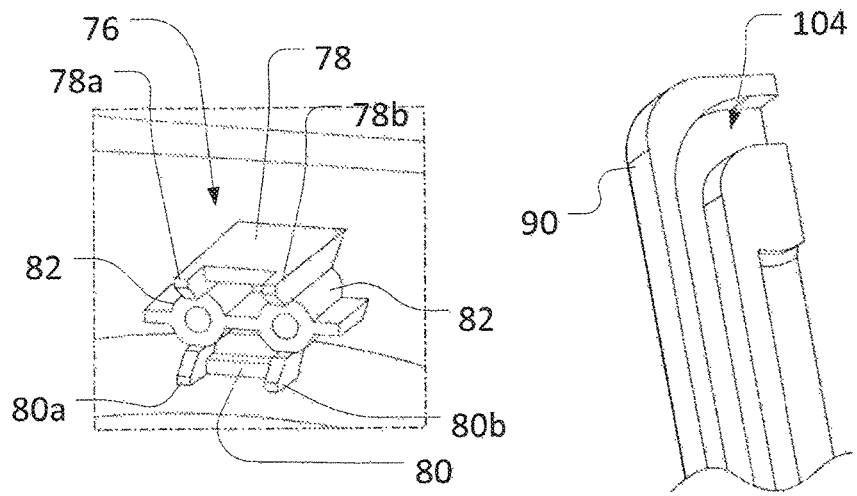
FIG. 7 is an enlarged view of area B-B of FIG. 4.

In some embodiments, a mounting feature can be provided on a housing body to assist in securing a terminal block (or other feature) to the housing body. For example, as illustrated in particular in FIGS. 4 and 7, a mounting feature 76 for a terminal block (not shown) extends outwardly on the first side 22a of the housing body 22. In the embodiment illustrated, the mounting feature 76 includes a set of guide features configured as columns 78 and 80 on upper and lower sides of a set of posts 82. The posts 82 are configured to receive fasteners (not shown) to secure the terminal block to the mounting feature 76, and thereby to the housing body 22. The columns 78 and 80 are each configured as plate-like features, with prongs 78a, 78b, 80a, and 80b at opposite lateral ends. In the embodiment illustrated, the prongs 78a, 78b, 80a, and 80b axially farther than the columns 78 and 80 and are somewhat thicker than the columns 78 and 80 in the vertical direction (from the perspective of FIG. 7). The prongs 78a, 78b, 80a, and 80b are generally aligned with and extend in parallel with, and past, a set of cylindrical posts 82. The prongs 78a, 78b, 80a, and 80b, as supported by the columns 78 and 80, can accordingly contact corresponding features on a terminal block in order to help to appropriately locate the terminal block to be secured to the posts 82.

In the embodiment illustrated, the second side 22b of the housing body 22 is configured as a cover side of the housing body 22, to which the housing cover 24 (or another cover) can be attached. As illustrated in FIG. 5 in particular, sets of clasps 88 corresponding in size and orientation to the hinge pins 40 of the housing cover 24 (see FIG. 2) can be provided on the second side 22b of the housing body 22. As illustrated, the clasps 88 are secured to a mounting flange 90 of the housing body 22, although other configurations are possible. When the hinge pins 40 are snapped into the clasps 88, the clasps 88 can hold the housing cover 24 to the housing body 22 while also permitting the housing cover 24 to pivot, at the hinge pins 40, relative to the housing body 22 (see FIG. 1). A set of tabs 86 at an upper end of the housing body 22 can be configured to engage the housing cover 24 (e.g., at corresponding recesses on the housing cover 24 (not shown)) in order to hold the housing cover 24 to the housing body 22 with the housing cover 24 pivoted to a closed orientation.

In order to accommodate filter media and guide appropriate air and liquid flows, housing bodies can include generally hollow "bell" portions of various configurations. For example, the housing body 22 includes a bell portion 92 that at least partly defines a cavity 94 within the housing body 22. Generally, the cavity 94 extends between an inlet opening 96 surrounded by the mounting flange 90 and the outlet opening 74 and can define a passage for fan-driven flow of air from the louvers 44 of the grille 38 (see, e.g., FIG. 1) to the outlet opening 74. A side-wall portion 98 of the bell portion 92 extends generally perpendicularly from the mounting flange 90, and a tapered portion 100 of the bell portion 92 tapers inwardly from the side-wall portion 98 to the mounting face 70.

In other embodiments, other configurations of a bell portion are possible. For example, a bell portion can include one or more flared ends, tapering of different degrees than illustrated for the tapering portion 100 (including, for example, multiple tapers of different inclinations or curvatures), no tapering, or other geometries.

To assist in securing the housing body 22 to an enclosure or other body, the side-wall portion 98 of the belt portion 92 supports a set of outwardly biased tabs 102 (see FIG. 4) that extend outwardly from the outer wall of the side-wall portion 98. To secure the housing body 22 to an enclosure (not shown), an opening can be formed in the enclosure with inner dimensions that generally correspond to the outer dimensions of the side-wall portion 98 and that are generally smaller than the outer dimensions of the mounting flange 90. The bell portion 92 can then be inserted through the opening until the mounting flange 90 is seated on an exterior (or interior) of the enclosure and the tabs 102 spring outward to engage an interior (or exterior) of the enclosure.

Figure 8:
FIG. 8 is an enlarged view of area C-C of FIG. 4.

In some embodiments, as illustrated in FIGS. 4 and 8 in particular, a recess 104 can be formed in the mounting flange 90 in order to help seal the interface between the mounting flange 90 and an enclosure (or other body). As illustrated, for example, the recess 104 exhibits a generally u-shaped cross-section and extends continuously around the entire mounting flange 90 on a side of the mounting flange 90 that faces towards the first side 22a of the housing body 22. Generally, the recess 104 can be sized to receive appropriate sealing media, such as a rope gasket or foam-in-place ("FIP") media, in order to form a seal between the housing body 22 and an enclosure (or other body). For example, with a rope gasket (not shown) disposed within the recess 104, when housing body 22 is inserted through an opening in an enclosure (as also described above), the rope gasket can be somewhat compressed between the mounting flange 90 and the outside of the enclosure. When the tabs 102 spring into place to hold the mounting flange 90 to the enclosure, this can maintain an appropriate compression of the rope gasket to reduce infiltration of liquid, dust, or other material through the interface between the mounting, flange 90 and the enclosure.

To support filter media (e.g., a foam filter), a housing body can generally include one or more filter supports with corresponding support surfaces. As illustrated in FIGS. 5 and 6 in particular, the filter housing body 22 includes a set of thin ribs 110 and a set of thicker ribs 112 extending from the walls of the bell portion 92 into the cavity 94. In the embodiment illustrated, the ribs 110 and the ribs 112 extend mainly from the tapered portion 100 of the bell portion 92, but also extend partly from the side-wall portion 98. In other embodiments, other configurations are possible.

In some embodiments, support features for a housing body can be formed as somewhat hollow features or with relatively wide support surfaces. For example, in the embodiment illustrated, the ribs 112 are formed with relatively wide support surfaces 112a within the cavity 94 (see, e.g., FIG. 5) and correspond to negative-space molded areas 112b on the exterior of the housing body 22 (see, e.g., FIG. 4). Other configurations are also possible. For example, the ribs 110 do not correspond to negative-space molded areas and are formed with are formed with relatively narrow support surfaces 110a.

It may be generally useful to configure support surfaces to support filter media that is spaced substantially apart from the flow inlets or outlets of a housing body. For example, as illustrated in FIG. 6 in particular, the support surfaces 110a and 112a of the ribs 110 and 112 are disposed at a relatively large distance 114 from the mounting face 70 and the outlet opening 74. Accordingly, when a fan (not shown) is secured to the mounting face 70 to move air through the outlet opening 74, a filter media 108 resting on the support surfaces 110a and 112a will be disposed at the distance 114 from the fan. This stands in contrast to conventional arrangements, in which filter media is separated from an outlet opening of a filter housing only by the axial thickness of a flat grating. Usefully, with appropriately selected values for the distance 114, this approach to supporting the filter media can increase the efficiency of the fan-driven air flow from the grille 38 (see, e.g., FIG. 1), through the filter media 108 and the cavity 94, to the outlet opening 74.

Other features can also serve to support filter media and/or to space filter media apart from an inflow or outflow opening of a housing (e.g., the outlet opening 74) and a fan secured thereto. In some embodiments, an air-permeable structure of a housing body can extend into the housing body in order to support the filter media. For example, in the embodiment illustrated, the housing body 22 includes a grating hub 116 that extends from the outlet opening 74 into the cavity 94. The grating hub 116 is generally configured as a flattened dome, with air-flow gaps provided between side struts 118 around an annular perimeter of the dome, and with air-flow gaps also provided between bars 120 of a support grating 122. In other embodiments, other configurations are possible, including non-flattened, non-domed, non-annular, or other types of air-permeable hubs, air-permeable hubs extending from other portions of a housing (e.g., a connection that is adjacent to an air inlet opening or extends from a side wall of the housing), and so on.

In some embodiments, an air-permeable structure can be a sole support for filter media within a housing body. In some embodiments, an air-permeable structure can support filter media in combination with other structures. The support grating 122 is generally configured to support filter media in conjunction with the ribs 110 and 112. As illustrated in FIG. 6 in particular, the support grating 122 is generally aligned in the axial direction with the support surfaces 110a and 112a of the ribs 110 and 112. Accordingly, the filter media can be supported on the support grating 122 as well as the support surfaces 110a and 112a, with the filter media spaced from the fan by the axial length of the side struts 118 as well as the thickness of the housing body 22 at the mounting face 70.

In the embodiment illustrated, the bars 120 of the support grating 122 are configured with a spoke-and-wheel arrangement and the support grating 122 extends generally in parallel with the support surfaces 110a and 112a, as well as with the mounting face 70 and the mounting flange 90. In other embodiments, other arrangements are possible.

In some embodiments, it may be useful to provide gaps for air flow between an air-permeable structure and adjacent portions of the relevant housing body. For example, in the embodiment illustrated, the side struts 118 extend axially away from the mounting face 70 to support the support grating 122, and are spaced laterally apart from the side walls of the tapered portion 100 of the bell portion 92 of the housing body 22. Usefully, the side struts 118 (and the support grating 122 generally) thereby provide an air-flow gap 126 within the housing body 22, configured as an extension of the cavity 94 along the lateral (e.g., circumferential) side of the grating hub 116. Accordingly, air moving through the housing body 22 can flow between the side struts 118 and the tapered portion 100, as well as through the air-flow gaps between the side struts 18 and the bars 120 of the support grating 122 (via the air-flow gaps 126).

In other embodiments, other configurations are possible for an air-permeable hub or other filter-support structure. For example, a filter-support portion can be configured similarly to the support grating 122 or in various other ways. Similarly, side structures to support a filter-support portion can be configured similarly to the side struts 118 or in various other ways. For example, side structures can extend from a filter-support structure at generally right angles (e.g., as with the side struts 118) or at various other angles:

In the embodiment illustrated, the air-flow gap 126 includes a generally continuous annular space extending fully around the circumference of the grating hub 116. Accordingly, for example, a fan-driven air flow can move through the filter media 108 to the outlet opening 74 via the support grating 122 or the air-flow gap 126 and the air-flow gaps provided between the side struts 118. In other embodiments, other configurations are possible. For example, a set of non-continuous air-flow gaps can be provided around an air-permeable support structure (e.g., the grating hub 116) in order to provide multiple flow paths for air flow to move through the air-permeable support structure.

In some embodiments, other support surfaces for filter media can be provided. For example, as illustrated in particular in FIG. 5, a set of the ribs 112 are integrally formed with a support wall 124 that extends inward from the tapered portion 100 of the bell portion 92 of the housing body 22, as well as from the side-wall portion 98 of the bell portion 92 of the housing body 22. The wall 124 supports one of the ribs 110, as well as a support surface 124a that extends continuously between the support surfaces 112a of the ribs 112 that are linked by the wall 124. The support surface 124a can also support filter media at a position that is removed from a fan, similarly to the support surfaces 110a and 112a, and the support grating 122 of the grating hub 116.

In some embodiments, the wall 124 and the support surface 124a can provide additional benefits. In the embodiment illustrated, for example, the wall 124 is disposed on a lower side of the bell portion 92 of the housing body 22 and extends generally continuously across the full local width of the cavity 94. Accordingly, the support surface 124a (and the wall 124 generally) can form a dam that can at least partly prevent water that has collected in the cavity 94 (e.g., water draining from the filter media) from flowing towards the first side 22a of the housing body 22, through the outlet opening 74, and into the fan and the relevant enclosure (or other body). This can beneficially reduce the amount of water that is able to enter an enclosure (or other body) through the housing body 22, even in relatively wet conditions.

Figure 9:
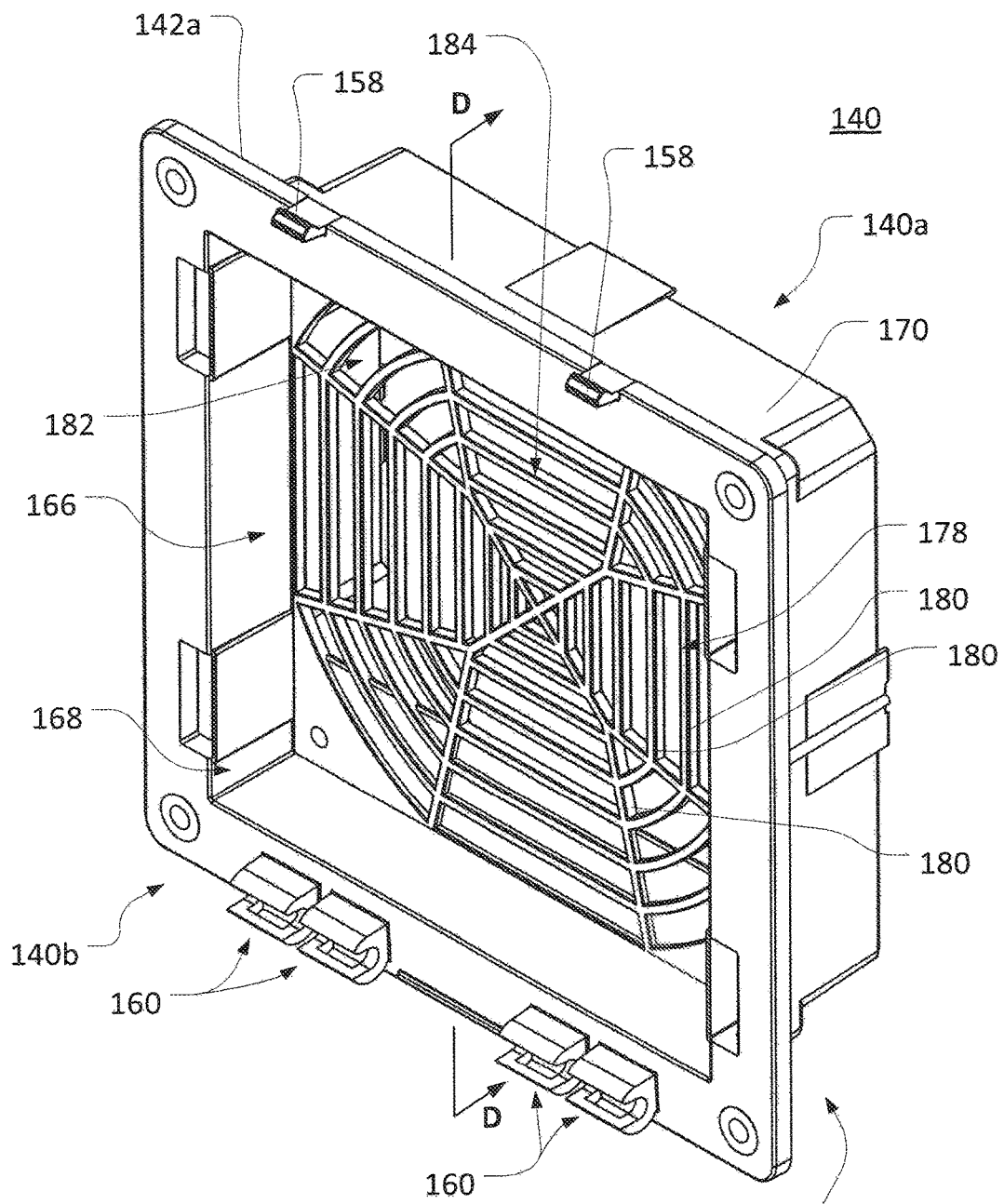
FIG. 9 is a front, right, top isometric view of a housing body according to another embodiment of the invention.
Figure 10:
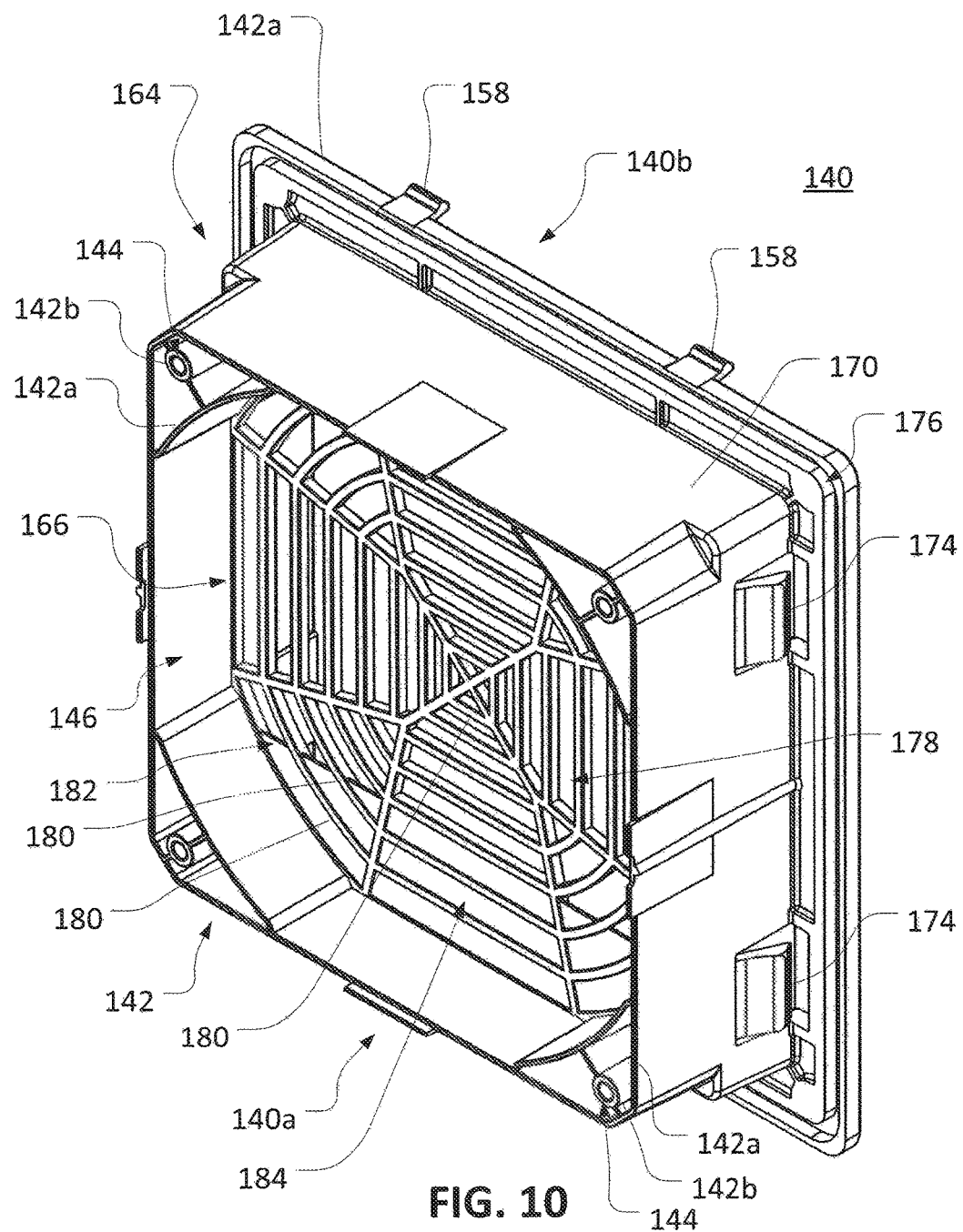
FIG. 10 is a back, left, top isometric view of the filter housing of FIG. 9.
Figure 11:
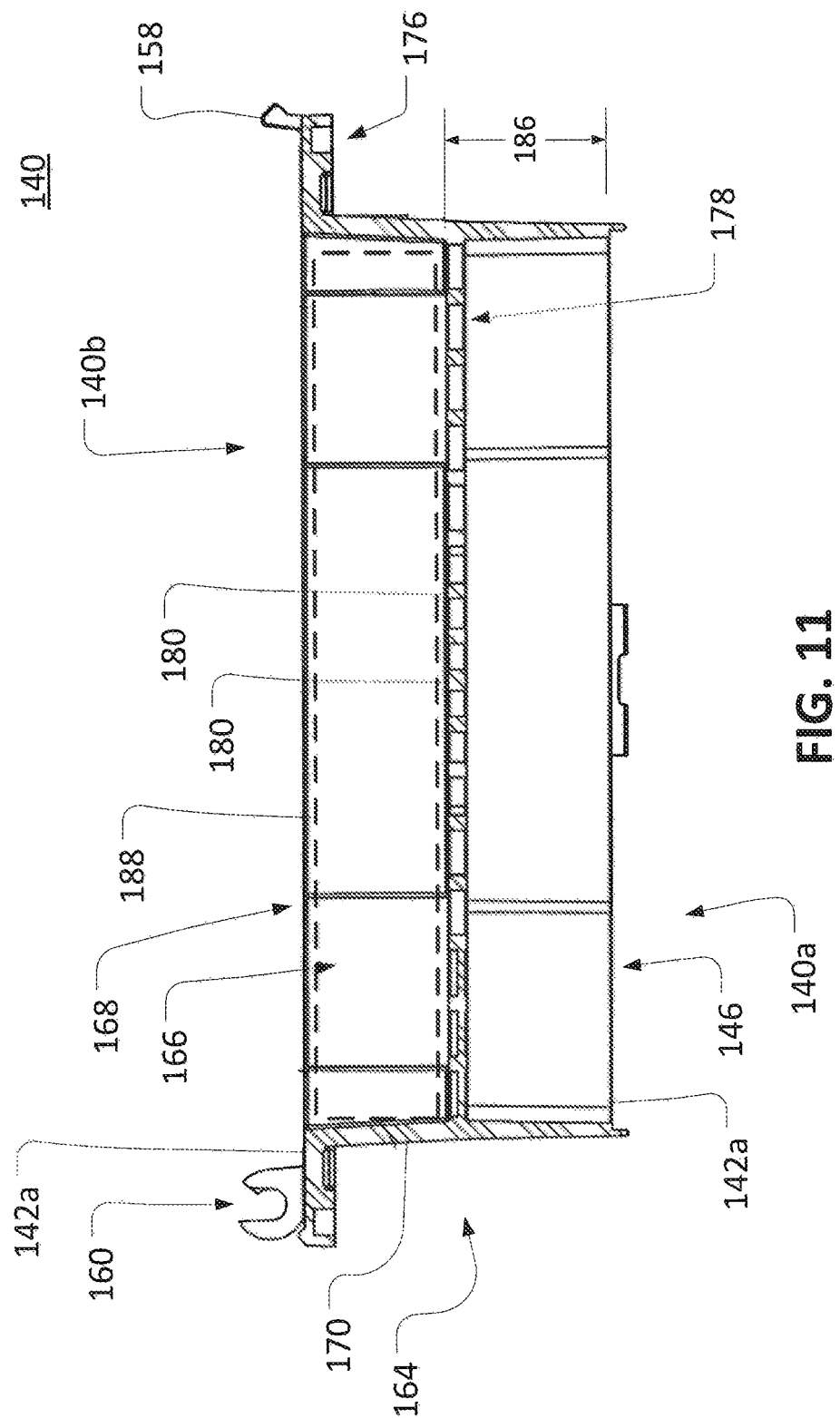
FIG. 11 is a cross-sectional view of the filter housing of FIG. 9, taken along plane D-D of FIG. 9.

FIGS. 9 through 11 illustrate a housing body 140 for a filter housing according to another embodiment of the invention. In some arrangements, the housing body 140 can be installed in the same or different size openings of an enclosure than the housing body 22. In some arrangements, the housing body 140 can be used with the same or different sizes or shapes of fans than the housing body 22.

Generally, the housing body 140 is formed as a unitary body, with a first side 140a and a second side 140b corresponding to opposite axial ends of the housing body 140. As illustrated in FIG. 10 in particular, the first side 140a is configured as a fan side of the housing, with a set of mounting features 142, including mounting walls 142a and mounting posts 142b, on which a fan (not shown) can be seated. Each of the mounting posts 142b includes a hole 144 through which fasteners (not shown) can extend to secure a fan to the housing body 140. Generally, an internal set of the mounting walls 142a surrounds an outlet opening 146, through which air flow driven by the fan can exit the housing body 140.

In some embodiments, a particular fan (not shown) for attachment to the mounting face 142 can have a rectangular (e.g., square) perimeter profile with similar dimensions to the illustrated rectangular configuration of an outer set of the mounting walls 142a. In some embodiments, a spacer (not shown) can be attached to the housing body 140 (e.g., via the mounting, posts 142b), and a fan attached to the spacer.

In the embodiment illustrated, the second side 140b of the housing body 140 is configured as a cover side of the housing body 140, to which the housing cover 24 (or another cover) can be attached. As illustrated in FIG. 9 in particular, a set of clasps 160 corresponding in size and orientation to the hinge pins 40 of the housing cover 24 (see FIG. 2) can be provided on the second side 140b of the housing body 140. As illustrated, the clasps 160 are secured to a mounting flange 162 of the housing body 140, although other configurations are possible. When the hinge pins 40 are snapped into the clasps 160, the clasps 160 can hold the housing cover 24 to the housing body 140 while also permitting the housing cover 24 to pivot, at the hinge pins 40, relative to the housing body 140 (see FIG. 1). A set of tabs 158 at an upper end of the housing body 140 can be configured to engage the housing cover 24 (e.g., at corresponding recesses in the housing cover 24 (not shown)) in order to hold the housing cover 24 to the housing body 140 with the housing cover 24 pivoted to a closed orientation.

Between the first side 140a and the second side 140b of the housing body 140, the housing body 140 includes a bell portion 164 that at least partly defines a cavity 166 within the housing body 140. Generally, the cavity 166 extends between an inlet opening 168 surrounded by the mounting flange 162 and the outlet opening 148 and can define a passage for fan-driven flow of air from the louvers 44 of the grille 38 (see, e.g., FIG. 1) to the outlet opening 148. In the embodiment illustrated, a side-wall 170 of the bell portion 164 extends generally perpendicularly from the mounting flange 162, between the inlet opening 168 and the outlet opening 146, and exhibits a slight inward taper from a perspective moving from the first side 140a to the second side 140b of the housing body 140.

To assist in securing the housing body 140 to an enclosure or other body, the side-wall 170 of the bell portion 164 includes a set of outwardly biased tabs 174 (see FIG. 10) that extend somewhat outward from the outer wall of the side-wall 170. In some embodiments, the tabs 174 can help to secure the housing body 140 to an enclosure (not shown) similarly the tabs 102 as discussed above with regard to FIG. 4.

In some embodiments, as illustrated in FIGS. 10 and 11 in particular, a recess 176 can be formed in the mounting flange 162 in order to help seal the interface between the mounting flange 162 and an enclosure (or other body). In some embodiments, the recess 176 can be configured similarly to the recess 104, as discussed above with regard to FIGS. 4 and 8.

To support filter media (e.g., a foam filter), the housing body 140 includes a grating 178 extending between interior surfaces of the side-wall 170 of the housing body 140. Similarly to the grating hub 116, the grating 178 can include air-flow gaps between bars 180 of the grating that allow air flow driven by the fan to pass through the cavity 166.

As illustrated in FIGS. 9 and 10 in particular, the bars 180 are arranged in interleaved circular sector patterns 182 and pentagonal patterns 184 and extend generally perpendicularly to the direction of the air flow through the cavity 166. In other embodiments, other arrangements are possible.

Similarly to the ribs 110 and 112 and the grating hub 116 of the housing body 22, the grating 178 can help to support the relevant filter media within the cavity 166 with the filter media spaced apart from the outlet opening 146. For example, as illustrated in FIG. 11 in particular, the bars 180 of the grating 178 are disposed at a distance 186 from the outside ends of the mounting walls 142a. Accordingly, when a fan (not shown) is disposed on the mounting walls 142a

(e.g., as secured in place using the mounting posts 142*b* (see FIG. 10)) and filter media 188 is resting on a side of the bars 180 that is opposite the fan, the filter media will be disposed at approximately the distance 186 from the fan (including the axial width of the bars 180). This stands in contrast to conventional arrangements, in which filter media may be separated from an outlet opening of a filter housing and a fan disposed at the outlet opening by only the axial thickness of a flat grating disposed between the fan and the filter media. Usefully, with appropriately selected values for the distance 186, this arrangement can increase the efficiency of the fan-driven air flow from the grille 38 (see, e.g., FIG. 1), through the filter media 188 and the cavity 166, to the outlet opening 146.

Figure 13:
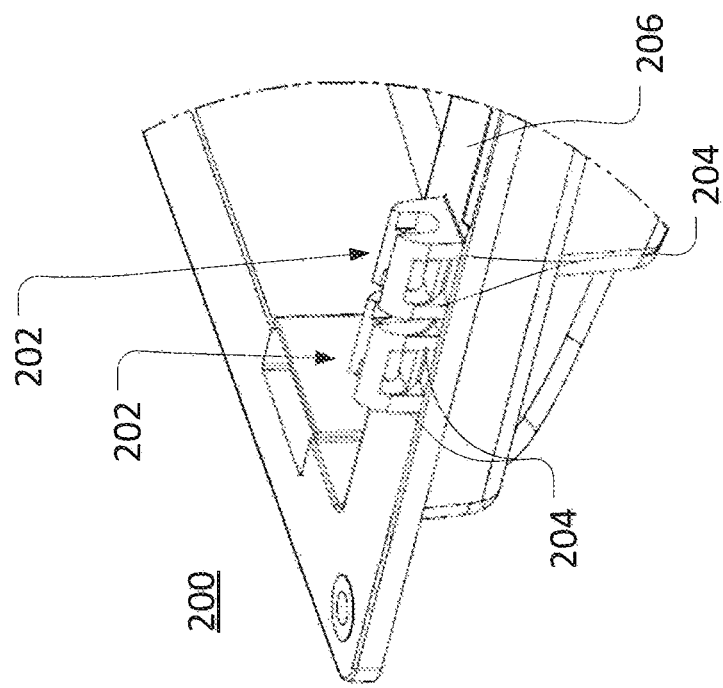
FIG. 13 is a partial front, right, bottom isometric view of still another housing body according to one embodiment of the invention.
Figure 12:
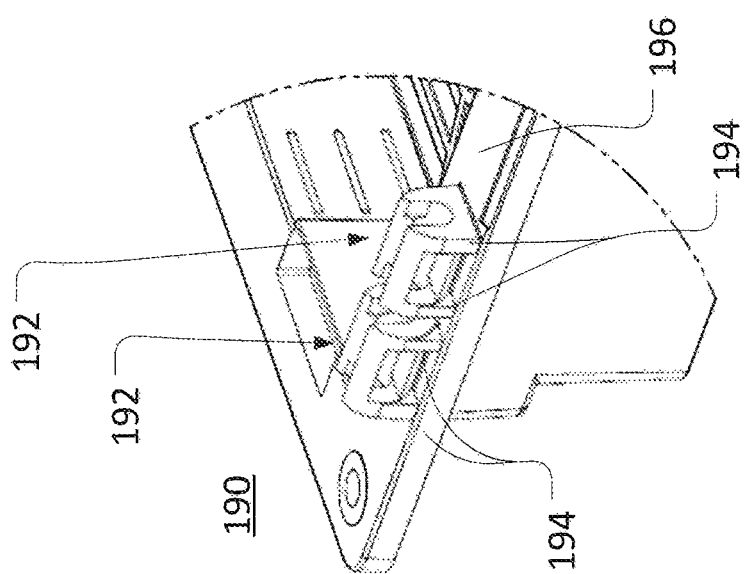
FIG. 12 is a partial front, right, bottom isometric view of another housing body according to one embodiment of the invention.

In other embodiments, other configurations are possible. For example, FIG. 12 illustrates part of a housing body 190 with clasps 192 that are generally similar to the housing body 140 and the clasps 160, respectively (see, e.g., FIGS. 9 and 11). In contrast to the clasps 160, however, the clasps 192 include sets of spaced-apart supporting ribs 194 that extend generally perpendicularly from a mounting flange 196 of the housing body 190. Similarly, FIG. 13 illustrates part of a housing body 200 with clasps 202 that are generally similar to the housing body 22 and the clasps 88, respectively (see, e.g., FIGS. 5 and 6). In contrast to the clasps 88, however, the clasps 202 include sets of spaced-apart supporting ribs 204 that extend generally perpendicularly from a mounting flange 206 of the housing body 200.

Thus, embodiments of the disclosure provide for an improved filter fan housing. In some embodiments, for example, a louvered housing cover can be easily opened and closed via a hinged connection with a housing body. In some embodiments, a housing body can be configured to improve air flow and general system efficiency. For example, support structures, including air-permeable support structures, can be configured to hold filter media at a location that is substantially spaced apart from an outlet opening for fan-drive flow. In some embodiments, support structures for filter media can also help to reduce the amount of liquid flowing through the housing body.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A housing body for supporting filter media relative to a fan and an enclosure, the housing body comprising:
   a first air opening at a first axial end of the housing body;
   a second air opening at a second axial end of the housing body, the second air opening including a mounting face that is configured to support the fan outside of the housing body;
   a bell portion disposed between the first air opening and the second air opening and defining a cavity within the housing body; and
   a grating hub extending axially into the cavity between the first axial end and the second axial end to support the filter media within the cavity, with the filter media opposite the grating hub from the second end and spaced apart from the second air opening;
   the grating hub including:
      an air-permeable hub support structure that extends axially away from the mounting face and into the bell portion, the air-permeable hub support structure being spaced laterally from bell portion to define one or more air-flow gaps; and
      a support grating that is supported by the air-permeable hub support structure within the bell portion, to support the filter media within the bell portion with the filter media spaced axially away from the fan by at least an axial length of the air-permeable hub support structure.

2. The housing body of claim 1, wherein the grating hub extends into the cavity from a connection adjacent to the second air opening.

3. The housing body of claim 1, wherein the one or more air-flow gaps are configured so that air flow from the first air opening to the second air opening passes at least partly through the filter media to the air-flow gaps, and from the air-flow gaps through the air-permeable hub support structure to the second air opening.

4. The housing body of claim 1, wherein the bell portion includes:
   a side-wall portion that at least partly defines a mounting space for the filter media; and
   a tapered portion that extends at least partly between the side-wall portion and the second air opening, and that tapers inwardly in a direction moving from the side-wall portion towards the second air opening.

5. The housing body of claim 4, wherein the grating hub extends into the tapered portion of the bell portion from a connection adjacent to the second air opening.

6. The housing body of claim 1, further comprising:
   one or more filter-support structures that extend from the bell portion into the cavity to further support the filter media within the cavity.

7. The housing body of claim 6, wherein the one or more filter-support structures include a first rib, a second rib, and a support wall extending along the bell portion between the first and second ribs.

8. The housing body of claim 7, wherein the first and second ribs and the support wall collectively define a continuous axial-facing support surface for supporting the filter media within the cavity, with the first and second ribs extending at an angle from the support wall.

9. The housing body of claim 8, wherein the support wall at least partly defines a water dam extending continuously across at least one side of the bell portion.

10. A filter housing for a fan assembly that is configured to use filter media and a fan, the filter housing comprising:
   a first side including a first flow opening for a fan-driven airflow;
   a second side opposite the first side, the second side including a second flow opening for the fan-driven airflow and mounting face that is configured to support the fan outside of the filter housing; and
   a bell portion at least partly defining a cavity between the first and second flow openings; and
   an air-permeable filter-support structure extending from the second side of the filter housing into the cavity;
   the air-permeable filter-support structure including:
      a filter-support portion configured to support the filter media within the cavity, wherein the filter-support portion is air-permeable; and
      a side structure that extends at a non-zero angle relative to the filter-support portion to support the filter-support portion relative to the bell portion, wherein the side structure is air-permeable and defines one or more air-flow gaps disposed laterally between the side structure and the bell portion;

the air-permeable filter-support structure being configured to support the filter media so that a first portion of air flow between the first and second flow openings passes sequentially through the filter and the filter-support portion and a second portion of the air flow between the first and second flow openings passes sequentially through the filter, the one or more air-flow gaps, and the side structure.

11. The filter housing of claim 10, wherein the filter-support portion includes a support grating.

12. The filter housing of claim 10, further comprising:
a mounting feature for a terminal block; and
at least one guide feature proximate the mounting feature to guide placement of the terminal block on the mounting feature;
wherein the at least one guide feature includes at least one column extending from an outer surface of the bell portion and at least one prong extending from the at least one column.

13. A housing for supporting filter media relative to a fan and an enclosure, the housing comprising:
a unitary housing body that includes:
a first air opening at a first end of the unitary housing body, the first air being configured to admit into the unitary housing body an air flow driven by the fan;
a second air opening at a second end of the unitary housing body, the second air opening being configured to discharge from the unitary housing body the air flow driven by the fan;
a mounting face configured to support the fan with the fan outside of the unitary housing body;
one or more side walls disposed between the first air opening and the second air opening, the one or more side walls at least partly defining a cavity within the unitary housing body;
an air-permeable support structure disposed within the cavity between the one or more side walls, the air-permeable support structure having a thickness in a direction that extends between the first air opening and the second air opening, and the air-permeable support structure being configured to permit the air flow driven by the fan to pass from the first air opening and the second air opening; and
a grating hub including:
an air-permeable support surface for the filter media; and
one or more side supports that connect the air-permeable support surface to the unitary housing body,
wherein the one or more side supports are air-permeable along at least part of the one or more air-flow gaps and are spaced apart from the one or more side walls of the unitary housing body to provide one or more air-flow gaps between the one or more side supports and the one or more side walls for air flow into the unitary housing body;
a side of the air-permeable support structure that faces the first air opening being spaced apart from the second air opening by substantially more than the thickness of the air-permeable support structure, so that the air-permeable support structure supports the filter media within the unitary housing body with the filter media spaced apart from the second air opening by substantially more than the thickness of the air-permeable support structure.

14. The housing of claim 13, wherein air-permeable support structure includes a grating hub extending into the cavity.

15. The housing of claim 14, wherein the grating hub connects with the unitary housing body at one or more connection locations at the second end of the unitary housing body, the grating hub extending into the cavity from the one or more connection locations.

16. The housing body of claim 1, wherein the grating hub is configured as a flattened dome.

17. The filter housing of claim 10, wherein the filter-support structure is disposed between the fan and the filter media.

18. The housing of claim 14, wherein the grating hub is disposed between the fan and the filter media.

* * * * *